US010460067B2

(12) United States Patent
Sherazi et al.

(10) Patent No.: US 10,460,067 B2
(45) Date of Patent: Oct. 29, 2019

(54) METHOD OF PATTERNING TARGET LAYER

(71) Applicants: IMEC VZW, Leuven (BE); GLOBALFOUNDRIES INC., Grand Cayman (KY)

(72) Inventors: Syed Muhammad Yasser Sherazi, Leuven (BE); Guillaume Bouche, Brussels (BE); Julien Ryckaert, Schaerbeek (BE)

(73) Assignees: IMEC vzw, Leuven (BE); Globalfoundries Inc., Grand Cayman (KY)

( * ) Notice: Subject to any disclaimer, the term of this patent is extended or adjusted under 35 U.S.C. 154(b) by 0 days.

(21) Appl. No.: 15/791,210

(22) Filed: Oct. 23, 2017

(65) Prior Publication Data
US 2018/0113975 A1 Apr. 26, 2018

(30) Foreign Application Priority Data
Oct. 20, 2016 (EP) .................................... 16194923

(51) Int. Cl.
*G06F 17/50* (2006.01)
*H01L 21/30* (2006.01)
(Continued)

(52) U.S. Cl.
CPC ...... *G06F 17/5077* (2013.01); *H01L 21/0337* (2013.01); *H01L 21/0338* (2013.01);
(Continued)

(58) Field of Classification Search
CPC ....... H01L 21/823431; H01L 21/31144; H01L 21/3086; H01L 21/0337; H01L 21/76229;
(Continued)

(56) References Cited

U.S. PATENT DOCUMENTS 9,224,617 B2 * 12/2015 Pritchard ............ H01L 21/3088
9,269,627 B1 * 2/2016 Cheng ............... H01L 21/02532
(Continued)

OTHER PUBLICATIONS

Appeltans et al. "The Effect of Patterning Options on Embedded Memory Cells in Logic Technologies at iN10 and iN7," Design-Process-Technology Co-Optimization for Manufacturing XI, vol. 101480G, 2017, 13 pages.
(Continued)

*Primary Examiner* — Vibol Tan
(74) *Attorney, Agent, or Firm* — Knobbe, Martens, Olson & Bear LLP

(57) ABSTRACT

The disclosed technology generally relates to semiconductor fabrication, and more particularly to a method of defining routing tracks for a standard cell semiconductor device, and to the standard cell semiconductor device fabricated using the method. In one aspect, a method of defining routing tracks in a target layer over a standard cell semiconductor device includes forming mandrels and forming a first set and a second set of spacers for defining the routing tracks. The standard cell semiconductor device includes a device layer and the routing tracks for contacting a device layer. The routing tracks include at least two pairs of off-center routing tracks, a central routing track arranged between the pairs of off-center routing tracks, and at least two edge tracks arranged on opposing sides of the at least two pairs of off-center routing tracks. A minimum distance between an off-center routing track and the central routing track next to the off-center routing track is smaller than a minimum distance between adjacent off-center routing tracks.

19 Claims, 15 Drawing Sheets

(51) Int. Cl.
  *H01L 27/02*  (2006.01)
  *H01L 21/033* (2006.01)
  *H01L 21/308* (2006.01)
  *H01L 21/84* (2006.01)
  *H01L 27/11* (2006.01)
  *H01L 27/12* (2006.01)
  *H01L 21/762* (2006.01)
  *H01L 27/118* (2006.01)

(52) U.S. Cl.
  CPC ...... *H01L 21/3086* (2013.01); *H01L 21/3088* (2013.01); *H01L 21/76229* (2013.01); *H01L 21/84* (2013.01); *H01L 27/0207* (2013.01); *H01L 27/1104* (2013.01); *H01L 27/1203* (2013.01); *H01L 2027/11875* (2013.01)

(58) Field of Classification Search
  CPC . H01L 21/84; H01L 27/0207; H01L 27/1104; H01L 27/1203; H01L 121/32139; H01L 21/3088; H01L 29/6653; H01L 29/6656; H01L 21/02164; H01L 21/0217; H01L 21/30604; H01L 21/31116; H01L 21/027; H01L 21/823468; H01L 29/66545; H01L 21/31055; H01L 21/0338; H01L 2027/11875; G06F 17/5077
  See application file for complete search history.

(56) References Cited

U.S. PATENT DOCUMENTS

| | | | | |
|---|---|---|---|---|
| 9,362,165 B1* | 6/2016 | Bouche | ............... | H01L 23/5226 |
| 9,379,017 B1* | 6/2016 | Sung | ............... | H01L 21/823412 |
| 9,704,859 B1* | 7/2017 | Cheng | ................. | H01L 27/0886 |
| 9,786,545 B1* | 10/2017 | Bouche | ............. | H01L 21/76224 |
| 9,811,626 B2* | 11/2017 | Jeong | ................. | G06F 17/5072 |
| 9,859,281 B2* | 1/2018 | Chen | ................. | H01L 27/0924 |
| 9,893,166 B2* | 2/2018 | Bergendahl | ......... | H01L 29/6653 |
| 9,893,171 B2* | 2/2018 | Basker | ............. | H01L 29/66795 |
| 9,917,105 B2* | 3/2018 | Doris | ................. | H01L 27/1207 |
| 9,935,012 B1* | 4/2018 | Gao | ................. | H01L 21/823431 |
| 10,304,728 B2* | 5/2019 | Schultz | ............. | H01L 21/76877 |
| 2007/0249174 A1 | 10/2007 | Yang | | |
| 2012/0249182 A1 | 10/2012 | Sherlekar | | |
| 2014/0225270 A1 | 8/2014 | Yuan et al. | | |
| 2015/0170973 A1 | 6/2015 | Kim et al. | | |
| 2016/0049307 A1 | 2/2016 | Chen | | |
| 2017/0236755 A1* | 8/2017 | Basker | ............ | H01L 21/823431 257/192 |
| 2017/0309622 A1* | 10/2017 | Cheng | ................. | H01L 27/0886 |
| 2017/0372974 A1* | 12/2017 | Tseng | ..................... | H01L 22/26 |
| 2018/0090335 A1* | 3/2018 | Karve | ................. | H01L 21/3081 |
| 2018/0151381 A1* | 5/2018 | Chou | ................. | H01L 21/30604 |

OTHER PUBLICATIONS

Gao et al. "Rigorous Assessment of Patterning Solution of Metal Layer in 7 nm Technology Node," Journal of Micro/Nanolithography, MEMS, and MOEMS, Feb. 19, 2016, 10 pages.
Sherazi et al. "Architectural Strategies in Standard-Cell Design for the 7nm and Beyond Technology Node," Journal of Micro/Nanolithography, MEMS, and MOEMS, Feb. 25, 2016, 12 pages.
European Search Report dated Sep. 7, 2017 in EP Application No. 16194923.5 in 17 pages.

* cited by examiner

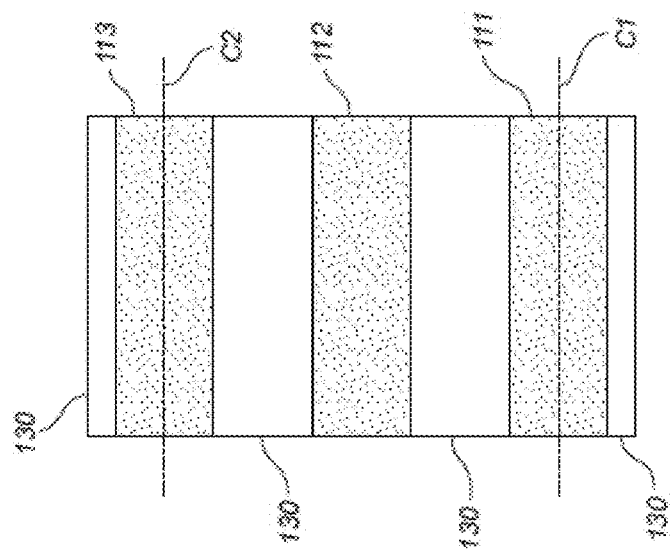
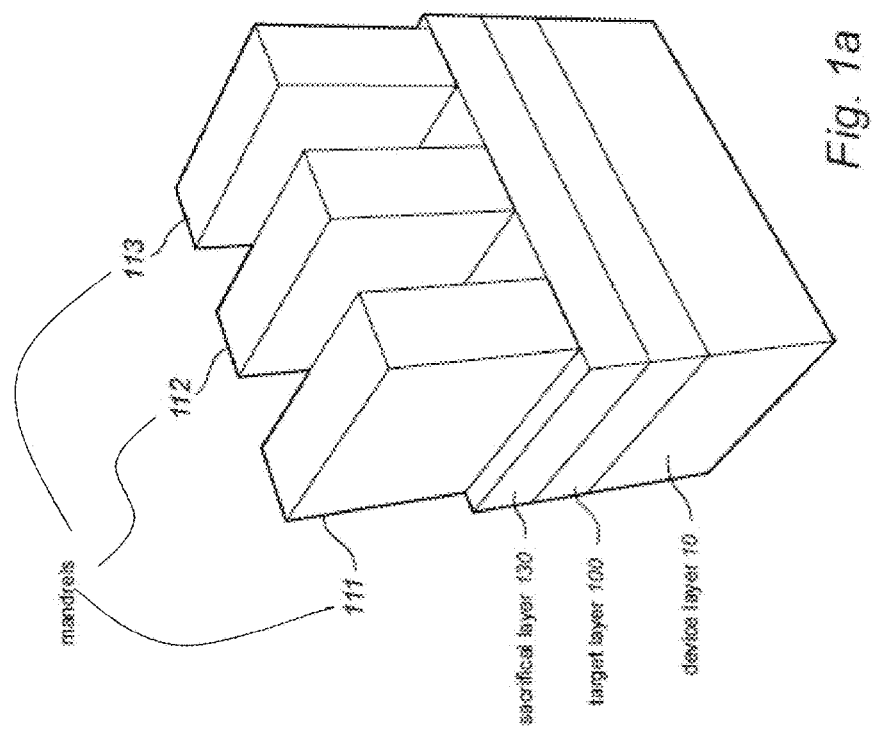
Fig. 1a
Fig. 1b

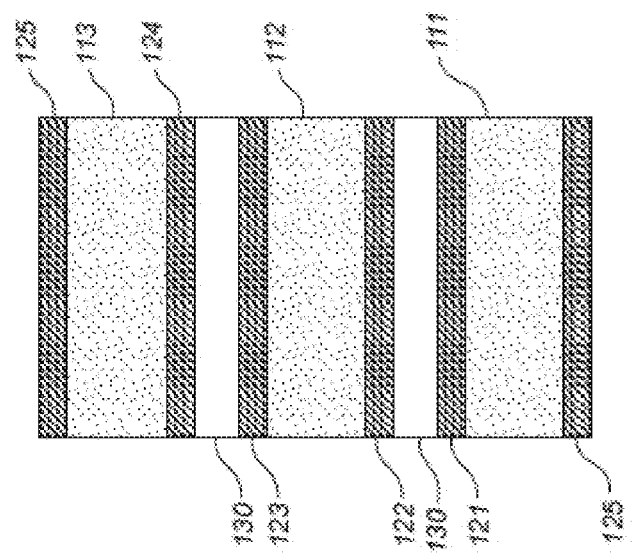
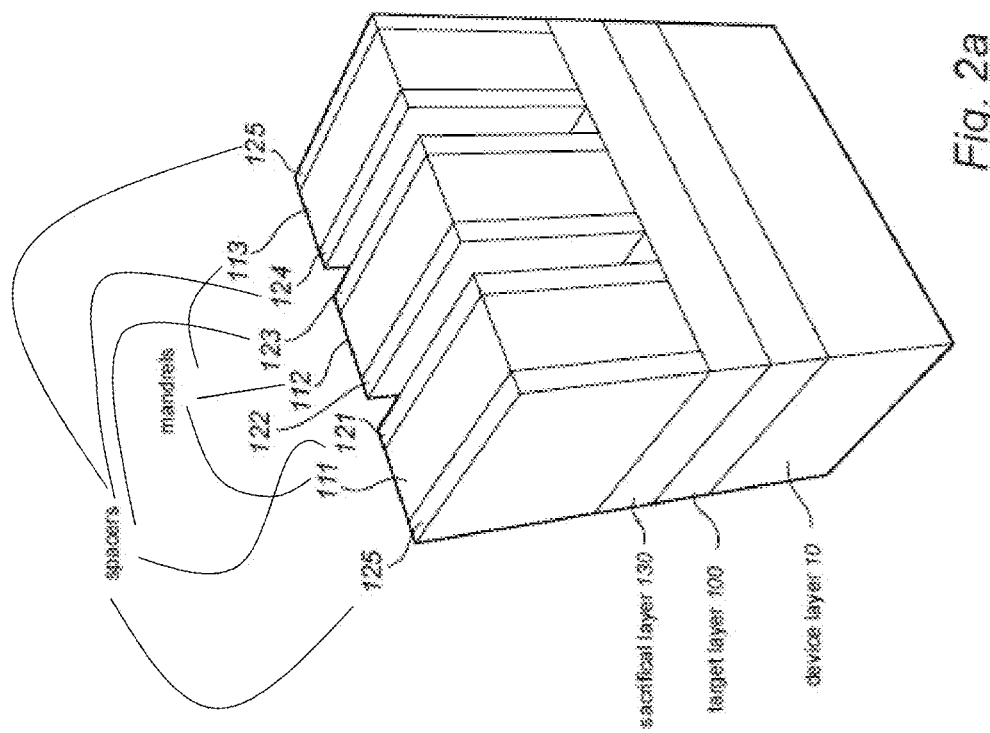
Fig. 2a
Fig. 2b

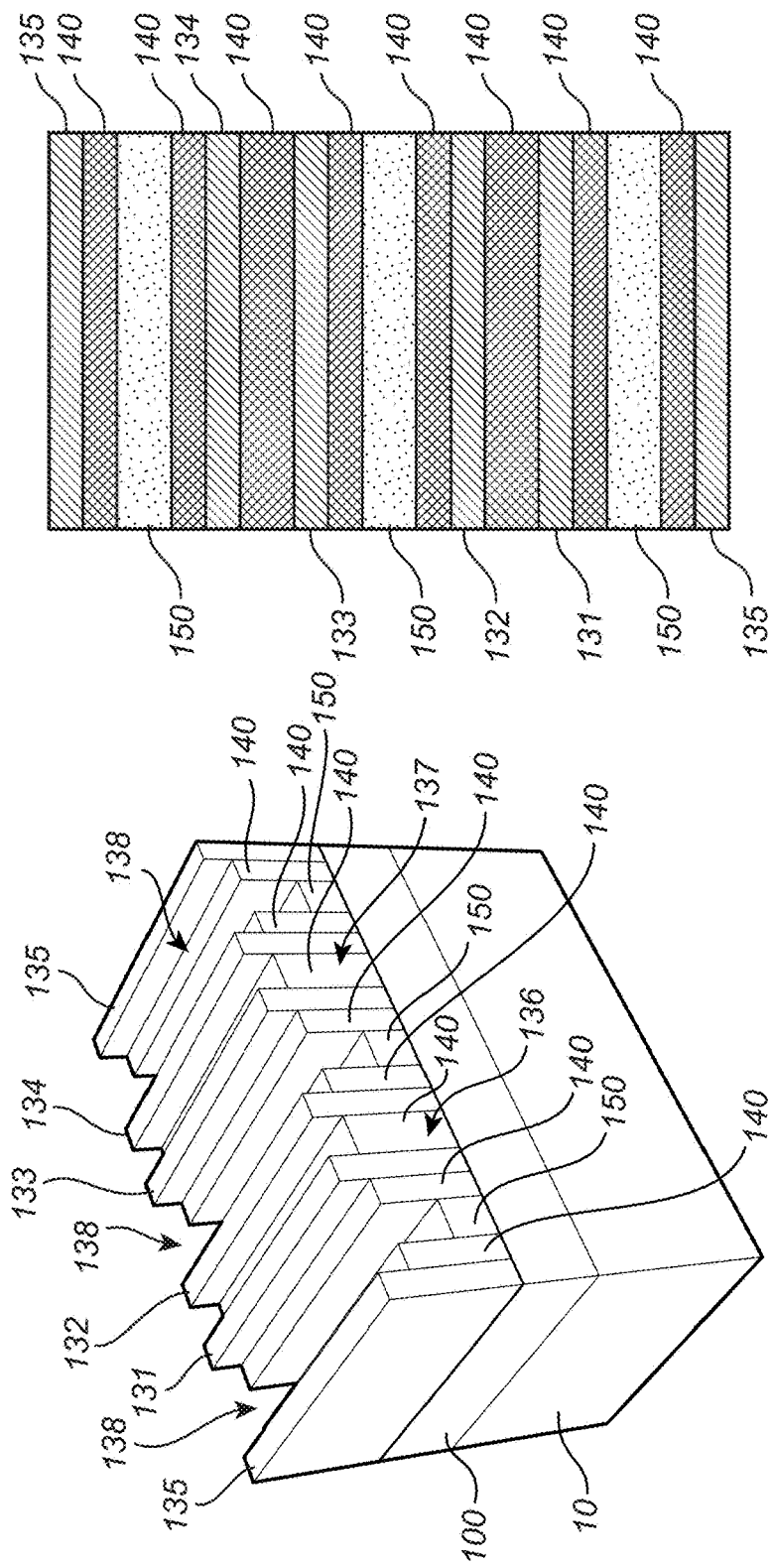

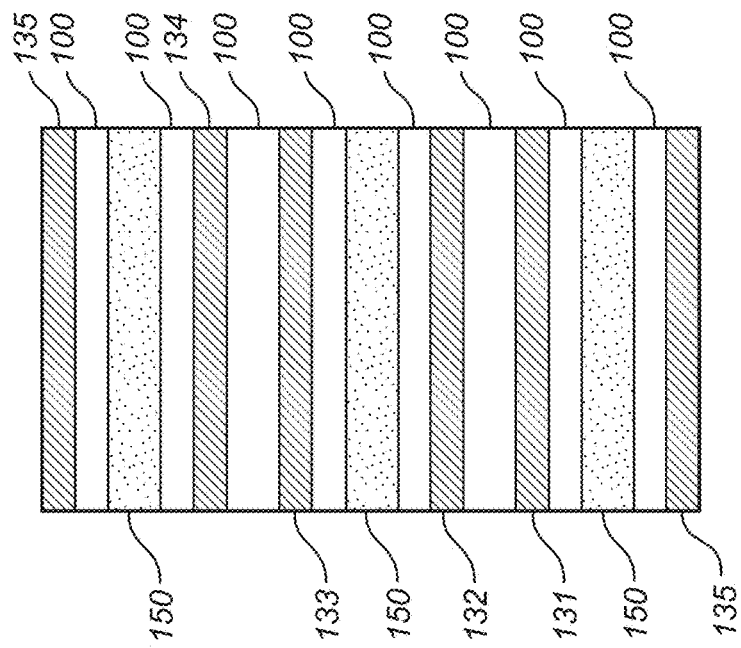
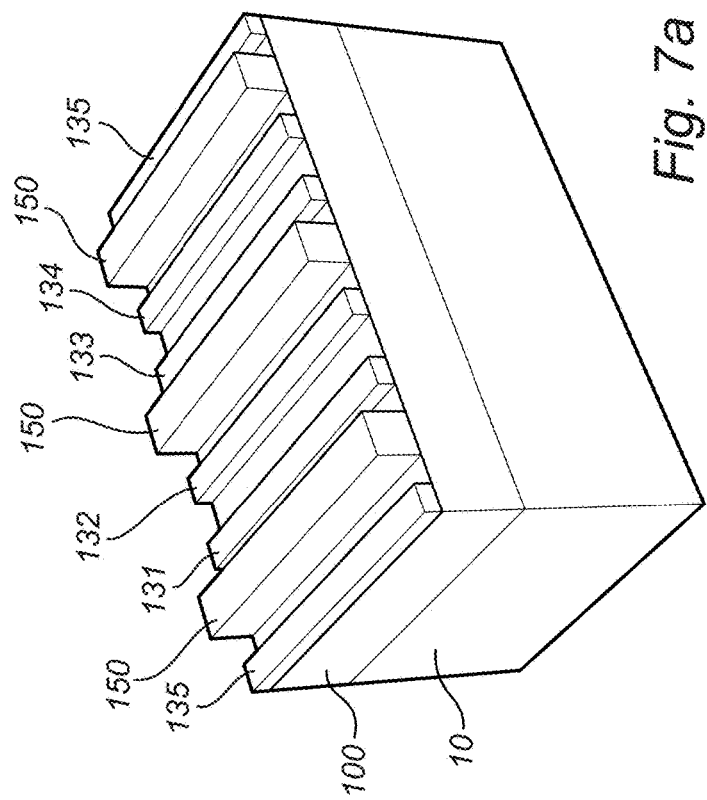
Fig. 7b
Fig. 7a

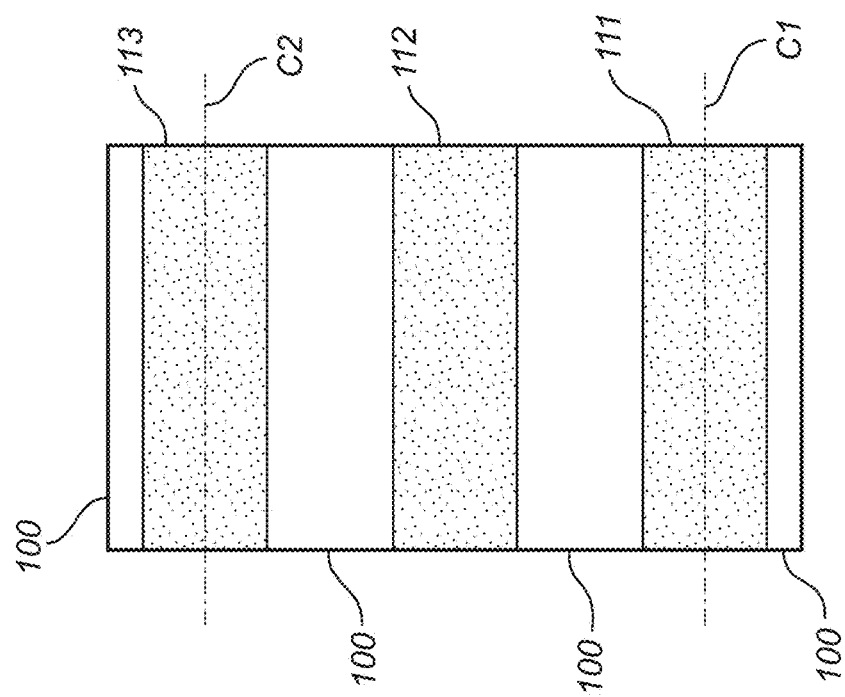
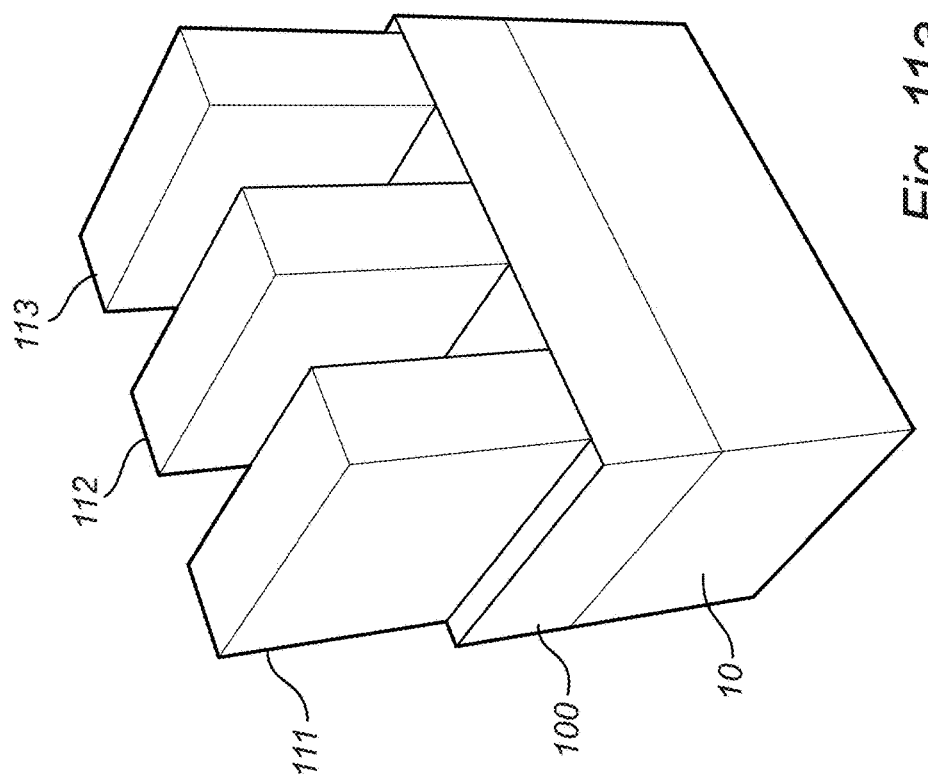
Fig. 11b
Fig. 11a

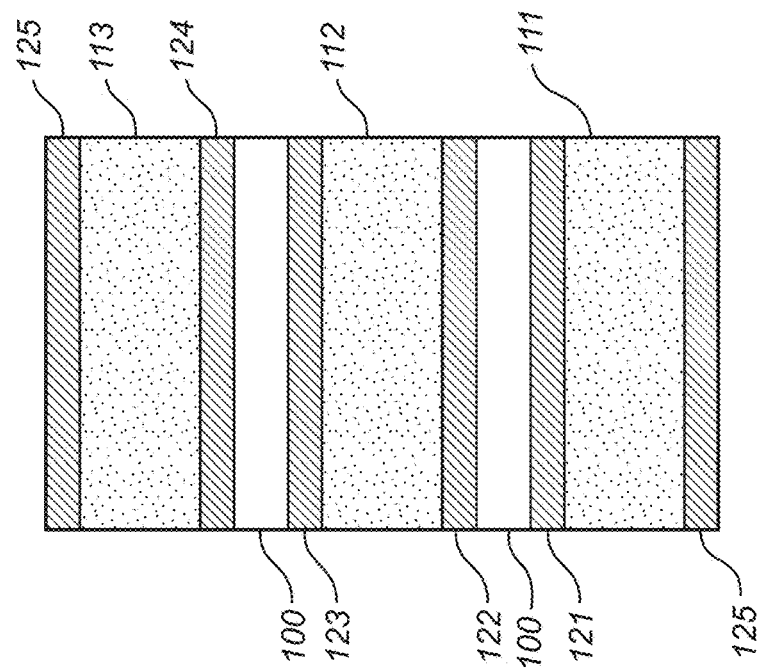
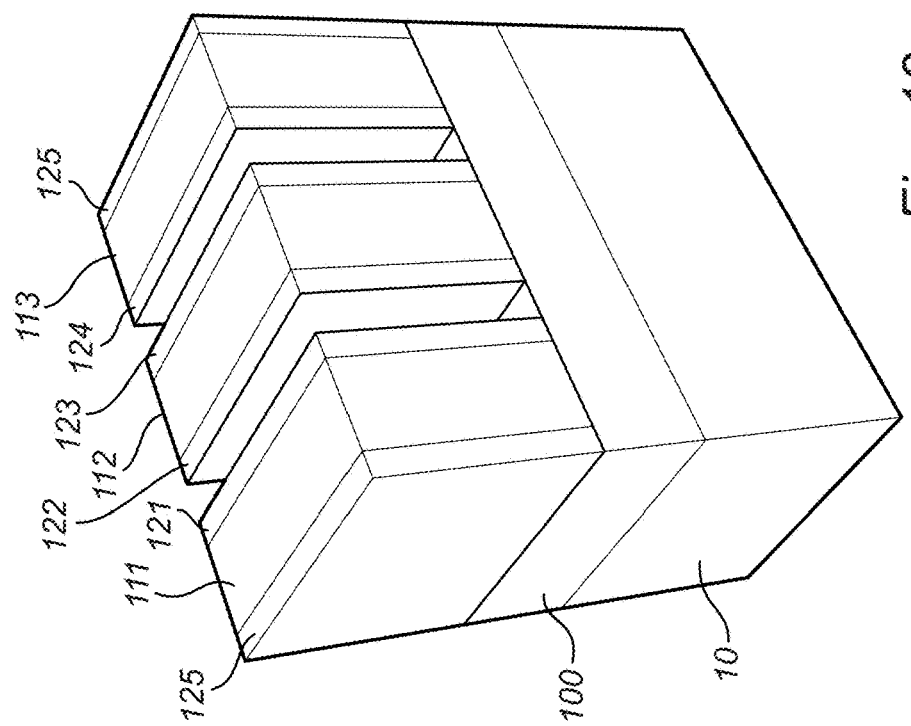
Fig. 12b
Fig. 12a

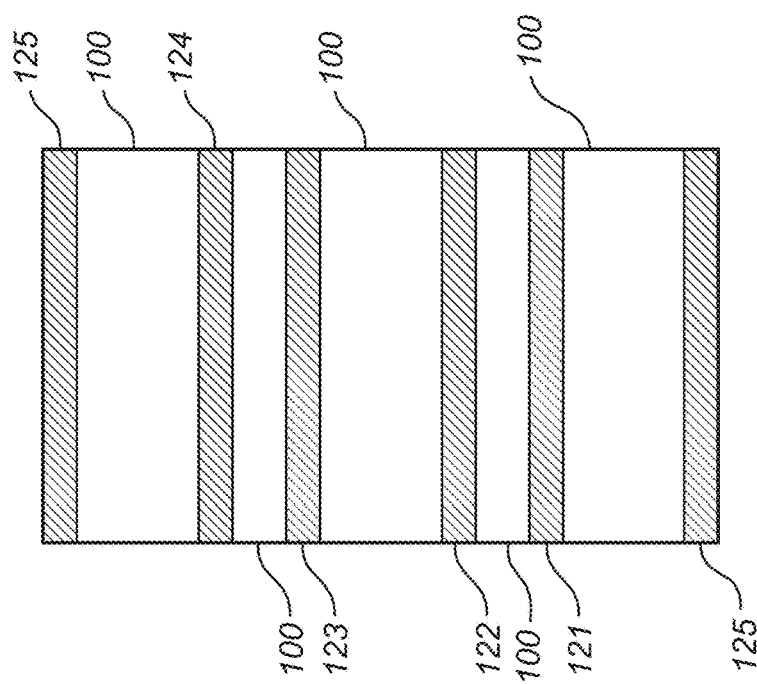
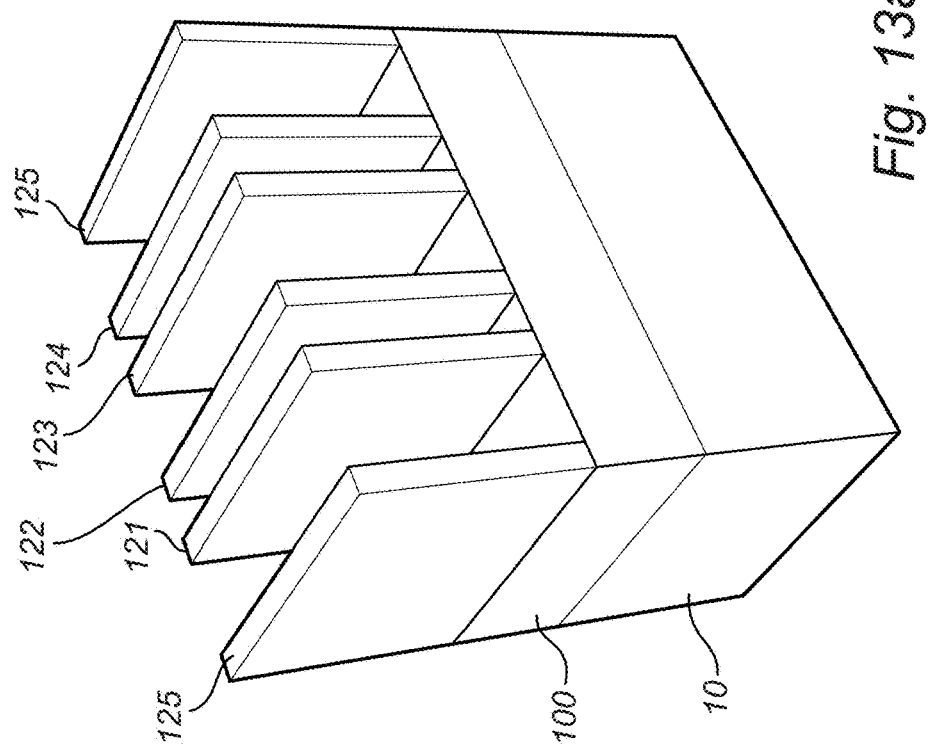
Fig. 13a
Fig. 13b

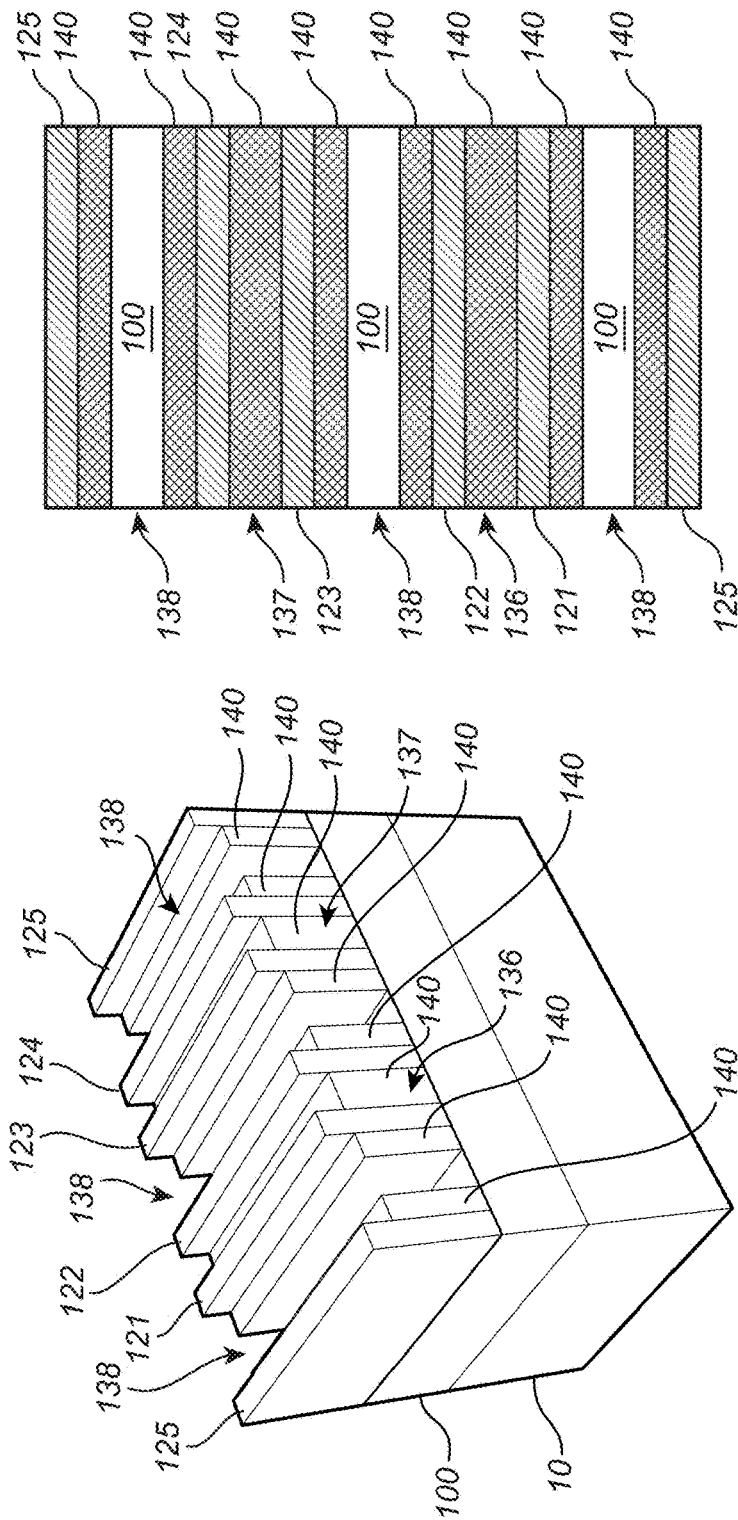

US 10,460,067 B2

METHOD OF PATTERNING TARGET LAYER

CROSS-REFERENCE TO RELATED APPLICATIONS

This application claims foreign priority to European Patent Application No. EP 16194923.5, filed Oct. 21, 2016, the content of which is incorporated by reference herein in its entirety.

BACKGROUND

Field

The disclosed technology generally relates to semiconductor fabrication, and more particularly to a method of defining routing tracks for a standard cell semiconductor device, and to the standard cell semiconductor device.

Description of the Related Technology

In semiconductor fabrication, standard cell methodology typically involves designing integrated circuits having various functionality using standard components and interconnected structures. Standard cell methodology uses an abstraction wherein low level integrated synthesis is replaced by a more high-level aspect of design. A standard cell can be made up of a group of transistor structures, passive structures, and interconnect structures that make up, e.g., logic functions, storage functions or the like.

As integrated circuits continue to scale while incorporating an increasing number of electronic components and functionalities within a given area, there is a strive for reducing the size of standard cells.

Multiple patterning is a technology that has been developed to enhance the feature density of the integrated circuits as the separation between neighboring features, such as, e.g., the routing tracks, approaches the wavelength of light used in a photolithographic method. In this technology, the complete pattern may be divided into two or more sub-patterns which are defined by individual sub-masks. The complete pattern may then be produced by transferring one sub-pattern at a time, using the corresponding sub-mask.

Even though such a technology may allow for a reduced standard cell area, there is still a need for improved methods and devices allowing for a further reduction of the cell size.

SUMMARY OF CERTAIN INVENTIVE ASPECTS

In view of the above, an objective of the present inventive concept is to provide a method of defining routing tracks in a target layer arranged above a standard cell semiconductor device, which allows for further reduction of the standard cell size. Additional and alternative objectives may be understood from the following.

According to a first aspect, there is provided a method of defining routing tracks to be formed in a target layer above a standard cell semiconductor device. The method comprises forming a first mandrel, a second mandrel and a third mandrel above the target layer, the second mandrel being arranged between the first mandrel and the third mandrel, providing a first spacer material on at least part of the sidewalls of said mandrels, thereby forming a first set of spacers including at least a first spacer on a sidewall of the first mandrel, said sidewall facing the second mandrel, a second and a third spacer on the second mandrel, and at least a fourth spacer on a sidewall of the third mandrel, said sidewall facing the second mandrel, removing said mandrels, transferring said first set of spacers into a dummy layer arranged between the target layer and the first set of spacers, thereby forming a set of spaced dummy features including a first, second, third and fourth dummy feature corresponding to said first, second, third and fourth spacer, wherein said set of dummy features defines positions of off-center routing tracks in the target layer, and providing a second spacer material on at least part of the sidewalls of said set of dummy features, thereby forming a second set of spacers, wherein spacers of said second set of spacers fill a gap between said first and second dummy feature and between said third and fourth dummy feature, and define a gap between said second and third dummy feature, said gap defining a position of a central routing track in the target layer.

According to a second aspect there is provided method of defining routing tracks to be formed in a target layer of a standard cell semiconductor device, wherein the method comprises forming a first mandrel, a second mandrel and a third mandrel above the target layer, the second mandrel being arranged between the first mandrel and the third mandrel, providing a first spacer material on sidewalls of said mandrels, thereby forming a first set of spacers including at least a first spacer on a sidewall of the first mandrel, said sidewall facing the second mandrel, a second and a third spacer on the second mandrel, and at least a fourth spacer on a sidewall of the third mandrel, said sidewall facing the second mandrel, wherein said first set of spacers defines positions of off-center routing tracks in the target layer, removing said mandrels, and providing a second spacer material on at least the sidewalls of said first set of spacers, thereby forming a second set of spacers, wherein spacers of said second set of spacers fill a gap between said first and second spacers and between said third and fourth spacer, and define a gap between said second and third spacer, said gap defining a position of a central routing track in the target layer.

The method according to the second aspect may thus be similar to the method according to the first aspect, with the difference that no dummy layer or sacrificial layer is used for transferring the pattern defined by the first set of spacers to the target layer. Instead, the second set of spacers may be formed at the sides of the spacers of the first set of spacers.

According to a third aspect, a standard cell semiconductor device is provided comprising a device layer and routing tracks for contacting the device layer. The routing tracks may include at least two pairs of off-center routing tracks and a central routing track arranged between the pairs of off-center routing tracks. Further, at least two edge tracks may be arranged on opposing sides of the at least two pairs of off-center routing tracks. According to the present aspect, a minimum distance between an off-center routing track and the central routing track next to the off-center routing track may be smaller than a minimum distance between adjacent off-center routing tracks, thereby allowing for a reduced height of the standard cell semiconductor device.

The present inventive method enables a reduction in height of the standard cell (as seen in a direction orthogonal to the routing tracks and in the plane of the device layer) by arranging at least some of the routing tracks at a non-uniform pitch or separation, such that the spacing between some of the tracks is reduced to save area. The area reduction may be illustrated in relation to a standard cell formed with a self-aligned double-patterning (SADP) technique. The lower limit for the nominal pitch (or individual track height) of such a cell would be determined by the sum of the minimum width of a routing track and the minimum separation to an adjacent routing track that can be formed by means of the SADP technique. Thus, if the top and bottom routing tracks of the standard cell are arranged to overlap the top and bottom boundary of the cell, minimum height would be achieved that corresponds to the sum of the nominal pitches. Considering an exemplary standard cell having seven routing tracks (of which two may be overlapping neighbouring cells), the standard cell obtained with SADP would have a height corresponding to six nominal pitches, whereas the non-uniform pitch according to the present inventive concept allows for a standard cell that can accommodate the same number of routing tracks within a height that is less than six nominal pitches.

The pitch between the routing tracks of the resulting standard cell semiconductor device is determined by the separation and width of the mandrels, the thickness of the first set of spacers (as seen in the height direction of the cell) and the thickness of the second set of spacers. These parameters may be selected such that the second spacer material is allowed to fill or plug the gap between the first and second dummy feature (or the first and second spacer, in case the second spacer layer is formed on the first spacer layer) and between the third and fourth dummy feature (or third and fourth spacer), and at the same time leaves the gap between the second and third dummy feature (or second and third spacer) unfilled. Whether the gaps will be filled or not may depend on the specific widths of the gaps and the thickness of the second spacer material that is arranged therein. In order for a gap to be filled, it may be no wider (i.e. less) than twice the thickness of the second spacer layer deposited on the sidewalls of the gap. Vice versa, the thickness of the second spacer layer may be no less than (i.e. equal to or greater than) half the width of the gap. Correspondingly, in order for a gap to be defined, i.e. unfilled by the second spacer layer, the width of the gap may exceed twice the thickness of the second spacer layer deposited therein.

A filled or plugged gap should be understood as a gap comprising a material or filler that covers or blocks access to the underlying material, such as, e.g., the target layer, and that is capable of acting as a mask during subsequent processing steps.

As already mentioned, the width of the gap (i.e. the width dimension parallel to the height direction of the cell) to be filled may be determined by the thickness of the first spacer layer that is deposited on the sidewalls of the mandrels, and by the separation between the sidewalls of neighbouring mandrels. Thus, an increased separation or spacing between the mandrels may be compensated by an increased thickness of the first spacer layer to maintain a specific gap width. Vice versa, a reduced mandrel separation may be compensated by reducing the thickness of the deposited first spacer layer.

Turning to the width of the gap (i.e. the width dimension parallel to the height direction of the cell) that is not filled by the second spacer layer, the width may be determined by the height (i.e. the height or width dimension parallel to the height direction of the cell) of a mandrel and the thickness of the second spacer layer that is deposited within the space or gap previously occupied by the mandrel. Thus, an increased mandrel width may be compensated by a reduced second spacer width so as to not fill or plug the gap.

The inventive methods hence allows for a minimum distance or separation between an edge track and an off-center routing track, and the distance between the central track and an off-center routing track, to be determined by controlling the thickness of the second set of spacers.

The spacers of the second set of spacers may be formed as a conformal layer, preferably by means of atomic layer deposition of the second spacer material. Spacers having a relatively high uniformity and well defined thickness may thereby be formed. The defined routing tracks hence allow for an enhanced regularity and improved process control, resulting in a device having improved reliability in terms of, e.g., time-delayed dielectric breakdown.

In a method according to the first aspect the first and second dummy feature may define positions of a first pair of off-center routing tracks. The third and fourth dummy feature may define positions of a second pair of off-center routing tracks. Correspondingly, in a method according to the second aspect the first and second spacer may define positions of a first pair of off-center routing tracks. The third and fourth spacer may define positions of a second pair of off-center routing tracks. The first and the second pair of off-center tracks may be defined on opposite sides of the (to be defined) central routing track.

As the separation between the tracks of a pair of off-center routing tracks may be defined by the relative positioning of the mandrels, the separation between those tracks may be formed by using a single patterning step for forming the mandrels. This is advantageous over multi-patterning techniques such as, e.g., consecutive lithography-etch-lithography -etch (LELE), which may introduce extra feature-to-feature position errors (overlay).

The first, second and third mandrels are features that may be used as support for subsequent growth of the first spacer layer. The mandrels may be formed in a single patterning step using a same mask, or in a multiple patterning process using several sub-masks. The patterning may be performed on a mandrel material layer that is formed above the target layer. The mandrel material layer may be arranged directly on a dummy layer, directly on the target layer, or on an intermediate layer arranged between the mandrel material layer and the dummy layer or target layer. Preferably, the first, second and third mandrels may be formed simultaneously, or during a same process, to reduce the number of photolithographic steps and complexity and cost.

The first set of spacers may be formed by depositing a first spacer material over the mandrels, preferably as a conformal layer, and etching the deposited first spacer material such that the first spacer material remains at least on at least some of the sidewalls of the mandrels, thereby forming the first set of spacers. The etch may be, e.g., anisotropic, leaving the first spacer material on the sidewalls.

In a next step the mandrels may be removed, leaving the first set of spacers for use in the subsequent processing. As the first set of spacers may comprise a somewhat rounded top (e.g. stemming from the deposition/etching of the first spacer material), it may (in accordance with the first aspect) be advantageous to transfer the first set of spacers into the dummy layer, or sacrificial layer, using the first set of spacers as an etch mask. The transferring may thus result in a structure or pattern in the dummy layer that may correspond to, or be similarly configured as, the first set of spacers. This allows for a set of well-defined dummy features to be formed, which can serve as a support for subsequent growth of the second spacer layer. Alternatively, (in accordance with the second aspect) the second spacer layer may be formed directly on the first set of spacer. This enables the number of processing steps to be reduced.

The second set of spacers may be formed by depositing a second spacer material over the dummy features (in a method according to the first aspect) or the first set of spacers (in a method according to the second aspect), preferably as a conformal layer, and etching the deposited second spacer material such that the second spacer material remains at least some of the sidewalls of the dummy features or the first set of spacers, thereby forming the second set of spacers. The etch may be, e.g., be anisotropic, leaving the second spacer material on the sidewalls.

The present inventive methods of the first and second aspect enables for the routing tracks to be defined in terms of position and extension within the standard cell. In other words, there are provided methods of determining the separation and width of the tracks rather than actually forming the tracks. The actual forming of the routing tracks in the target layer may be performed in subsequent processing steps according to advantageous embodiments that will be described in the following.

By "routing track" is hereby meant a space or design feature that can be used for defining a position or width in a standard cell. Accordingly, a conductor, via or conducting line may be formed in the routing tracks.

By height of a routing track, the standard cell or other structure or feature is herein meant the extension or dimension in a vertical direction of the standard cell, i.e., a direction perpendicular to the routing tracks of the cell and parallel to the main extension plane of the target layer (or a main surface of a substrate supporting the standard cell). In the context of the present application, the term height may be used interchangeably with the term width.

By the term "above" is hereby meant a relative position as viewed in a normal direction from the main surface of the device layer or a substrate supporting the standard cell. The terminology "above" does hence not refer to an absolute orientation of layers or features but to a relative ordering thereof.

By device layer is meant a semiconductor device layer, preferably supported on a substrate, in which a plurality of semiconductor devices are formed or implemented. The device layer may extend laterally along a main surface of the substrate. The device layer may be referred to as a front end of line (FEOL) portion of the substrate or the semiconductor device.

Further, an interconnection portion may be provided, including one or more metallization levels and one or more dielectric layers. Each metallization level may include a metallization layer. Metallization layers of adjacent metallization levels may be separated by a dielectric layer. The metallization layer may include conducting patterns or paths electrically interconnecting devices of the FEOL portion and/or portions (such as source, drain or gate) of individual semiconductor devices of the FEOL portion. The interconnection portion may include conducting vias connecting metallization layer through a dielectric layer. The interconnection portion may be referred to as a back end of line (BEOL) portion or a middle end of line (MOL) portion. The interconnecting portion may further be used for compensating any misalignment or differences in pitch between features or components of the device layer and the routing tracks, thereby providing a vertical (and possibly lateral) connection between the device layer and the routing tracks.

The central routing track may be understood as the one of the routing tracks that is arranged closest to a center or middle of the standard cell along the height direction. The term center or middle may refer to the position in the height direction with equal or similar distance to an upper and a lower boundary of the standard cell, or with equal number of off-center routing track on each sides. Consequently, the off-center tracks may refer to the remaining routing tracks arranged aside of the central routing track.

According to the present inventive concept, the position and width of the set of dummy features (or first set of spacers) may define the position and width of the off-center routing tracks, whereas the gap remaining between the spacers of the second set, which spacers are provided between the second and third dummy feature (or the second and third spacer), may define the position and the width of the central routing track.

According to one embodiment, the gap between the second and third dummy feature (or second and third spacer) may be filled or plugged, e.g., by depositing a filler material and etching it back such that a plug remains in said gap. Subsequently, the second set of spacers may be removed, leaving the plug and the dummy features (or first set of spacers) above the target material. Further, the plug and/or first set of spacers may be patterned, such as, e.g., cut into one or several segments. The (possibly patterned) plug and first set of spacers may be transferred to the target layer in an etch process in which the plug and first set of spacers are used as an etch mask. The patterning may include one or more of said dummy features or first set of spacers. Thus, it is possible that only some of the dummy features or first set of spacers may be transferred in the actual patterning of the target layer.

According to an embodiment, a dielectric layer, such as an inter-layer dielectric (ILD), may be added to the patterned target layer. This may be referred to as a refilling step, wherein a dielectric planarization layer may be deposited to embed the remaining structures of the patterned target layer in the dielectric layer. The planarization layer may have an upper surface flush/coplanar with an upper surface of the patterned target layer. In a subsequent step, these remaining structures may be removed, e.g., by etching, to form trenches or holes in the dielectric layer to expose contacting portions of the underlying device layer. The trenches or holes may then be filled with a conductor comprising, e.g., a metal. The conducting layer, which, e.g., may be formed in a damascene process, may thus form electrically isolated contacts in the regions defined by the routing tracks of the standard cell and providing electrical connection to the underlying semiconductor components of the device layer.

According to an embodiment, one of the mandrels may be arranged to overlap a first boundary of the standard cell and another one of the mandrels to overlap a second boundary of the standard cell. The first boundary may, e.g., be a lower boundary or perimeter of the cell, and the second boundary an upper boundary or perimeter (as seen in the height direction of the cell). Thus, at least two of the mandrels may be shared with neighbouring standard cells to further reduce the height of each standard cell. In case only three mandrels are used to define the routing tracks of the standard cell, this may result in a cell comprising four spacers within its boundaries, forming the first set of spacers defining the four off-center routing tracks. It will however be appreciated that more than three mandrels may be used for forming larger standard cells comprising, e.g., six or eight off-center routing tracks.

According to an embodiment, the device layer may comprise a transistor, wherein at least one of the off-center routing tracks may define a track connected to a source or drain of the transistor.

According to an embodiment, the device layer may comprise a transistor, wherein the central track may define a track connected to a gate of said transistor.

According to some embodiments, the device layer may comprise NMOS and PMOS transistors, preferably of a fin type, which may form, e.g., a CMOS device. The channels of the transistors may extend in the height direction of the cell.

Further objectives of, features of, and advantages with the present inventive concept will become apparent when studying the following detailed disclosure, the drawings, and the appended claims. Those skilled in the art will realize that different features of the present invention can be combined to create embodiments other than those described in the following.

BRIEF DESCRIPTION OF THE DRAWINGS

The above, as well as additional objects, features and advantages of the present inventive concept, will be better understood through the following illustrative and non-limiting detailed description of preferred embodiments of the present inventive concept, with reference to the appended drawings.

FIGS. 1a, 1b, 2a, 2b, 3a, 3b, 4a, 4b, 5a, 5b, 6a, 6b, 7a, 7b, 8a, 8b, 9a, 9b, 10a, 10b, 11a, 11b, 12a, 12b, 13a, 13b, 14a and 14b are intermediate structures at various stages of fabricating a target layer above a standard cell semiconductor device according to embodiments.

Figure 3B:
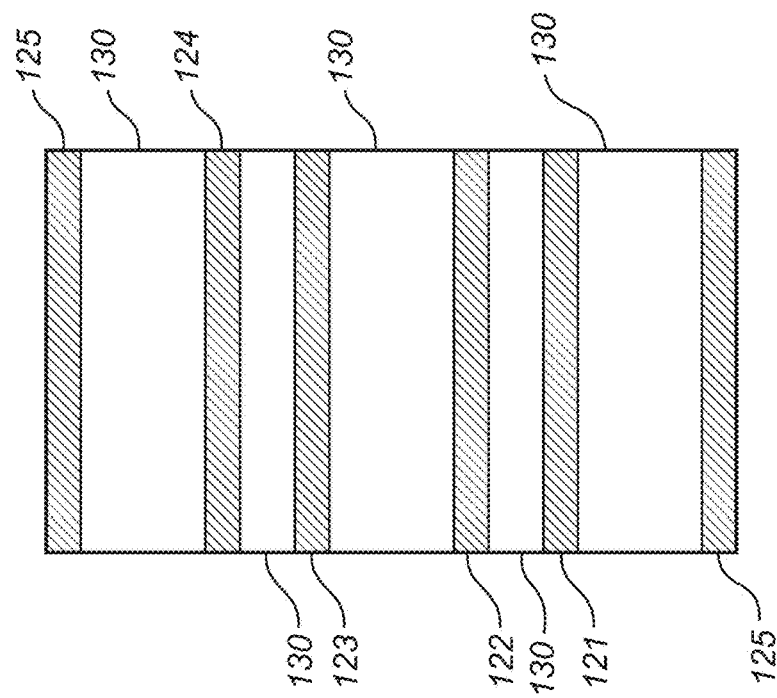

As illustrated in the Figures, the sizes of the elements, features and other structures may be exaggerated or not depicted proportionally for illustrative purposes. Thus, the Figures are provided to illustrate the general elements of the embodiments.

In the drawings, like reference numerals will be used for like elements unless stated otherwise.

DETAILED DESCRIPTION OF CERTAIN ILLUSTRATIVE EMBODIMENTS

A method of patterning a target layer and forming a standard cell semiconductor device will now be described with reference to FIGS. 1a, 1b, 2a, 2b, 3a, 3b, 4a, 4b, 5a, 5b, 6a, 6b, 7a, 7b, 8a, 8b, 9a, 9b, 10a, 10b, 11a, 11b, 12a, 12b, 13a, 13b, 14a and 14b, where the "a" Figures generally show perspective views and the "b" Figures generally show top views.

In FIG. 1a, a perspective view of a stacked structure is disclosed, wherein the stacked structure comprises a device layer 10, a sacrificial or dummy layer 130 and a target layer 100 in between. The target layer 100 may be arranged directly in the device layer 10, or on intermediate layer(s) not shown in FIG. 1a. This also applies to the sacrificial or dummy layer 130, which may be arranged directly on the target layer 100 or on an intermediate layer not shown in the present Figures. The sacrificial layer 130 may be used for transferring a well-defined pattern to the target layer 100. The device layer 10 may, e.g., comprise a plurality of semiconductor devices, including, e.g., transistors, capacitors, and resistors forming logical components and other electric devices. For explanatory purposes, the device layer 10 will merely be schematically indicated by feature 10 in the following detailed description and drawings.

The target layer 100 may comprise, e.g., amorphous silicon formed by, e.g., physical vapour deposition (PVD) or low temperature chemical vapour deposition (CVD), or an organic compound such as, e.g., spin-on deposited amorphous carbon, whereas the sacrificial layer 130 may comprise, e.g., a dielectric film, such as a silicon oxide or a silicon nitride film, or a doped version of such films. The dielectric film may, e.g., be formed by PVD, CVD or a spin-on technique.

To form a pattern defining the routing tracks for the standard cell, at least a first, second and third mandrel or core feature 111, 112, 113 may be formed over the sacrificial layer 130. The mandrels 111, 112, 113 may be formed by patterning an organic compound, such as, e.g., spin-on deposited amorphous carbon, arranged on, or at least above, the sacrificial layer 130. As indicated in FIG. 1a, the mandrels 111, 112, 113 may form a unidirectional pattern of substantially parallel portions exposing the underlying sacrificial layer 130. The exposed portions of the sacrificial layer 130 may be defined by substantially vertical and parallel sidewalls of the mandrels 111, 112, 113, whereas the mandrels 111, 112, 113 themselves may serve as masking portions during subsequent processing steps. The patterning of the mandrels may be performed in a single lithographic step.

FIG. 1b shows a top-view of a target material layer 130 comprising a first mandrel 111, a second mandrel 112 and a third mandrel 113. In the illustrated embodiment, the outer boundaries of the standard cell are indicated by the dashed lines C1 and C2. The boundaries may also be referred to as the bottom or lower boundary C1 and the top or upper boundary C2. The boundaries C1, C2 may thus be arranged opposite to each other, and may be separated from each other in the vertical direction or height direction of the standard cell.

According to the exemplary embodiment of FIG. 1b the first mandrel 111 may be arranged to overlap the lower boundary C1 and the third mandrel 113 to overlap the upper boundary C2, whereas the second mandrel 112 may be arranged in between. This arrangement allows for the first mandrel 111 and the third mandrel 113 to be shared with neighbouring standard cells (not shown in FIG. 1b).

In FIGS. 2a and 2b a first spacer material, such as an oxide having a high etch selectivity against the mandrels, has been formed on the sidewalls of the mandrels 111, 112, 113. The first spacer material may be deposited by a suitable conformal process such as atomic layer deposition (ALD) to form a conformal first spacer layer on the mandrels 111, 112, 113 and the exposed parts of the sacrificial layer 130. The first spacer layer may be patterned by an anisotropic etch to define a first set of spacers arranged on the sidewalls of the mandrels 111, 112, 113 and to remove the first spacer material on top of the mandrels 111, 112, 113 and to expose the sacrificial layer 130 between the mandrels 111, 112, 113. The first set of spacers may comprise a first spacer 121 on a sidewall of the first mandrel 111, the sidewall facing the second mandrel 112, a second and a third spacer 122, 123 on the second mandrel 112, and a fourth spacer 124 on a sidewall of the third mandrel 113, the sidewall facing the second mandrel 112. Further, first spacers 125 may be formed on the remaining sidewalls of the first mandrel 111 and the third mandrel 113, i.e., the sidewalls facing away from each other.

The separation between the mandrels 111, 112, 113 and the thickness of the first spacer layer may be selected such that a gap is defined between the first spacer 121 and the 122, and between the third spacer 123 and the fourth spacer 124. The width of these gaps may determine the separation or isolation between the routing tracks of each pair of off-center tracks of the final standard cell semiconductor device.

Figure 3A:
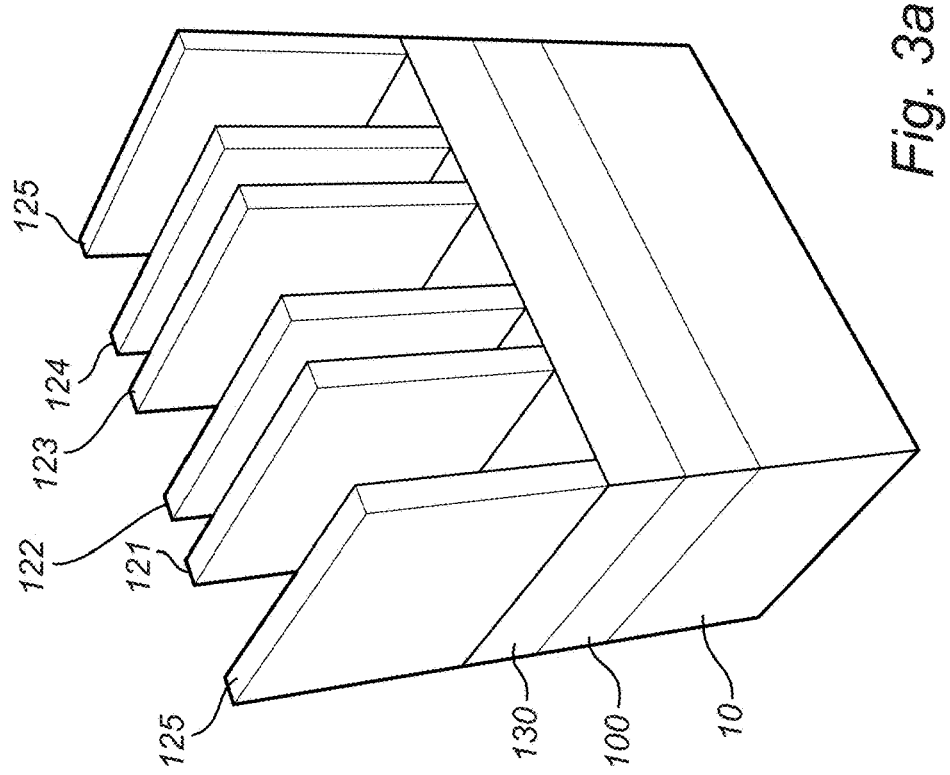

FIGS. 3a and 3b show the first set of spacers 121-125 after the mandrels 111, 112, 113 have been removed. The mandrels 111, 112, 113 may, e.g., be removed by plasma ashing followed by a wet strip. As indicated in the Figures, the width and separation of the mandrels 111, 112, 113 and the thickness of the first set of spacers 121-125 may be selected such that the separation or gap between the second spacer 122 and the third spacer 123 is larger than the separation or gap between the first and second spacer 121, 122 and between the third and fourth spacer 123, 124, respectively. Preferably, the above-mentioned dimensions are selected such that the smaller gaps (between the first and second spacers 121,122 and the third and fourth spacers 123, 124) may be filled or plugged by a second spacer material (as shown in FIGS. 5a and 5b).

Figure 4B:
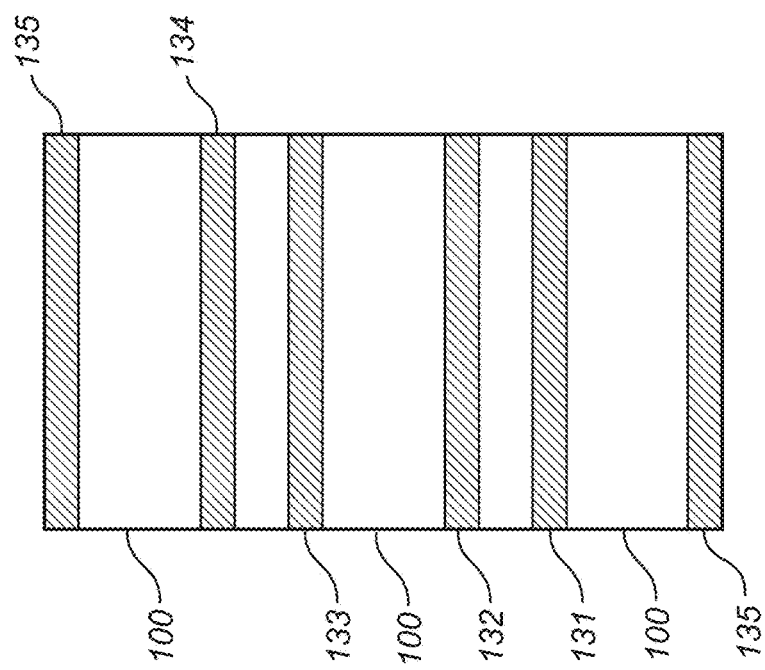
Figure 4A:
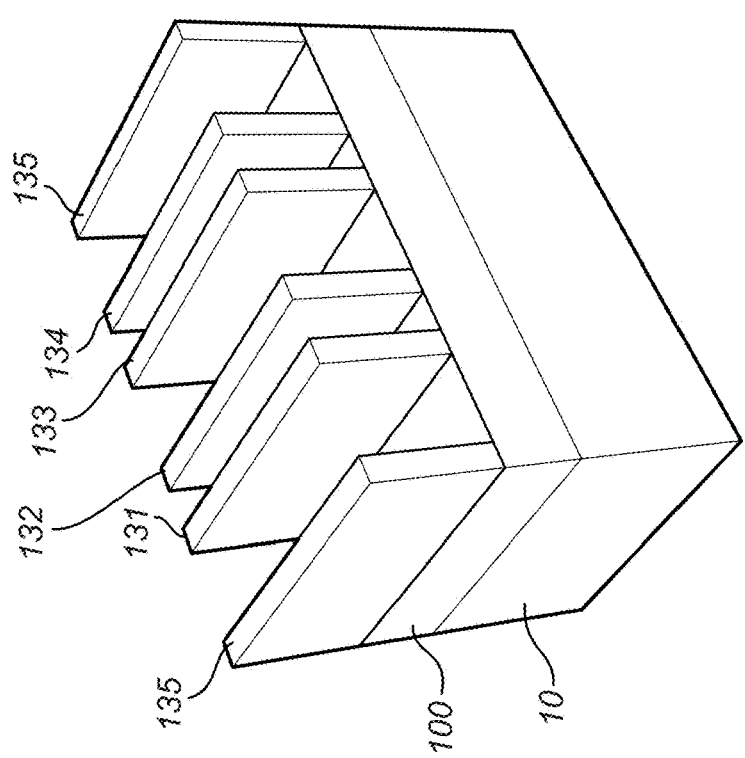

In FIGS. 4a and 4b, the pattern of the first set of spacers 121-125 has been transferred to the underlying sacrificial layer 130. The transfer may be realised by means of etching, using the first set of spacers 121-125 as an etch mask. The resulting structure shown in FIGS. 4a and 4b comprises a set of spaced sacrificial or dummy features 131, 132, 133, 134, 135, exposing portions of the underlying target layer 100. Preferably, the set of sacrificial features 131-135 are similarly arranged as the corresponding first set of spacers 121-125.

Figure 5B:
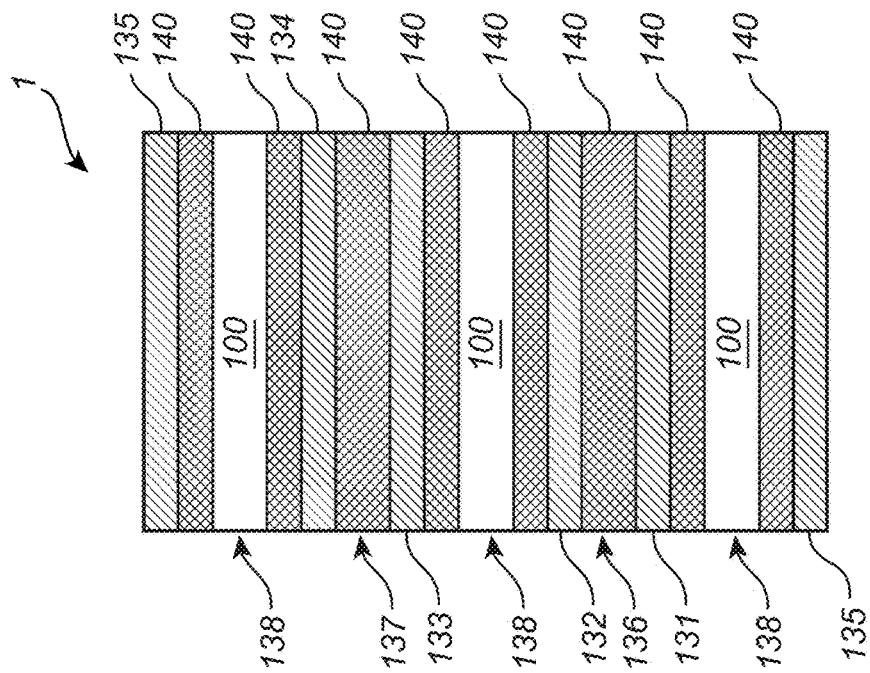
Figure 5A:
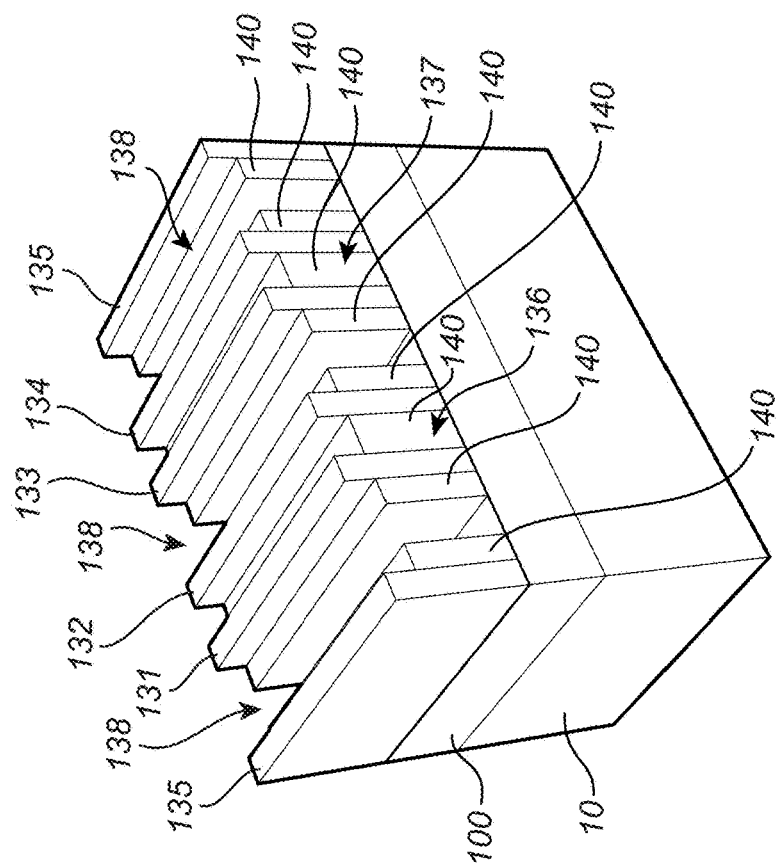

As already mentioned, FIGS. 5a and 5b show the set of sacrificial or dummy spacers 131-135 after a second spacer material has been formed on at least part of the spacers of the set of sacrificial spacers 131-135. The second spacer material may comprise, e.g., atomic-layer deposited (ALD) SiN, or ALD $SiO_2$ or $TiO_2$, and may be formed in a similar way as the first spacer material to form a second set of spacers 140 on the sidewalls of the sacrificial spacers 131-135. The second spacer layer, comprising the second set of spacers 140, may be provided with a thickness that allows the second spacer layer to plug or at least partly fill the gap 136 between the first sacrificial spacer 131 and the second sacrificial spacer 132, e.g., without leaving a horizontal gap between the first and second sacrificial spacers 131, 132, and the gap 137 between the third sacrificial spacer 133 and the fourth sacrificial spacer 134, e.g., without leaving a horizontal gap between the third and fourth sacrificial spacers 133, 134. Further, the thickness of the second spacer layer may be selected to still allow a gap 138 between the second and third sacrificial spacer 132, 133, exposing the underlying target layer 100. A gap 138 may also be defined over the top and bottom boundaries of the standard cell.

In a subsequent step, the gap(s) 138 may be filled or plugged with a second filler 150 indicated in FIGS. 6a and b. The second filler may, e.g., be an organic film deposited by a spin-on or CVD technique suitable for gap-filling.

Figure 8B:
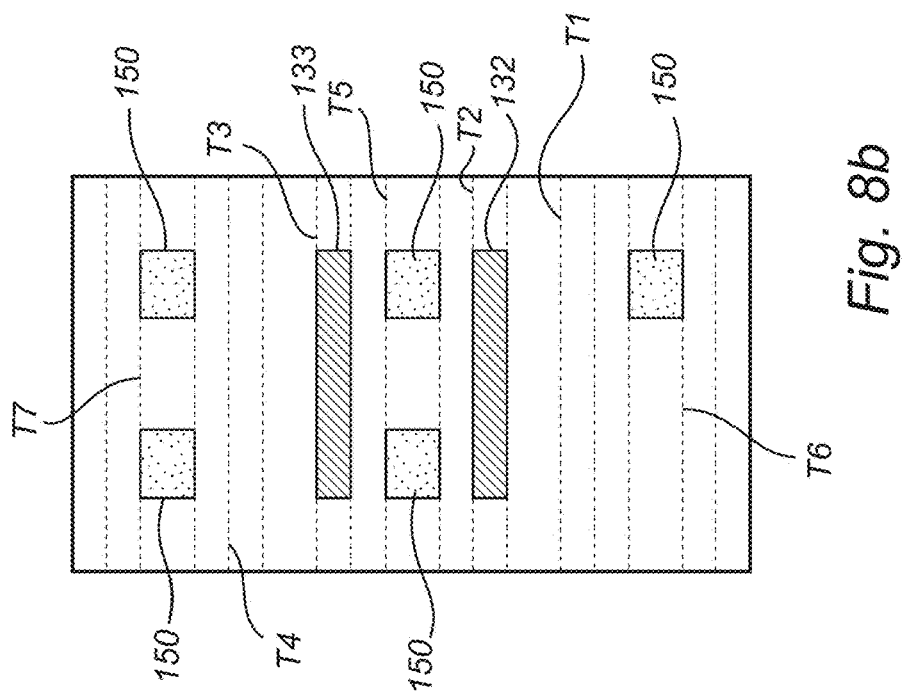
Figure 8A:
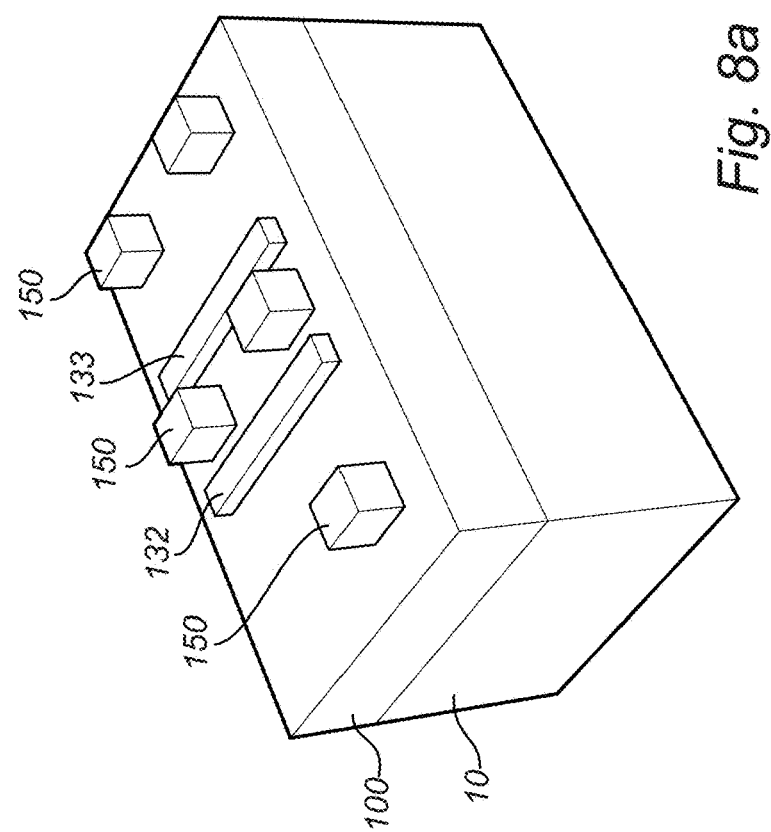

In FIGS. 7a and 7b, the second set of spacers 140 has been removed to expose the underlying target material 100. The remaining plug of the second filler 150 and the sacrificial spacers 131-135 may be patterned as indicated in FIGS. 8a and 8b, thereby forming an etch mask that can be used for transferring a desired pattern to the target layer 100. FIG. 8b shows the structure of the etch mask in relation to the defined routing tracks of the standard cells, wherein T1 and T2 refers to a first pair of off-center routing tracks, T3 and T4 to a second pair of routing tracks, T5 to the center routing track, and T6 and T7 to the edge routing tracks.

Figure 9B:
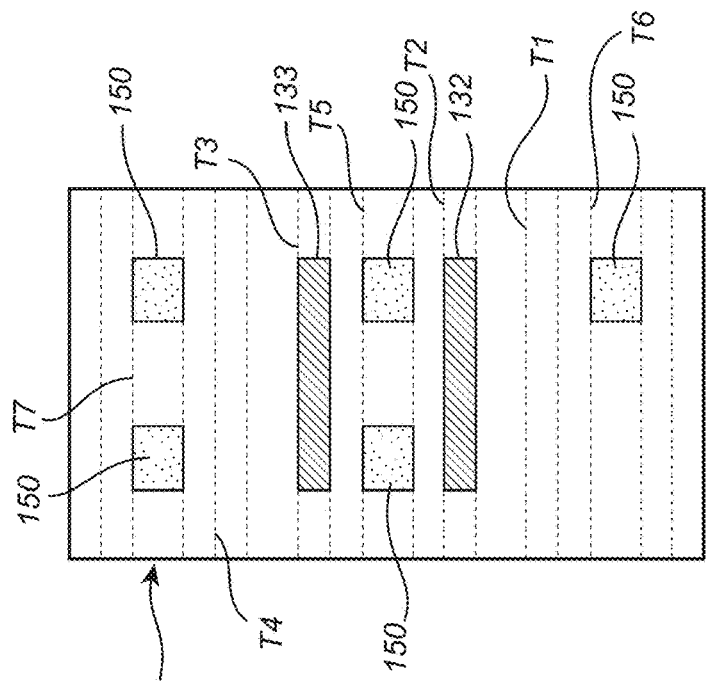
Figure 9A:
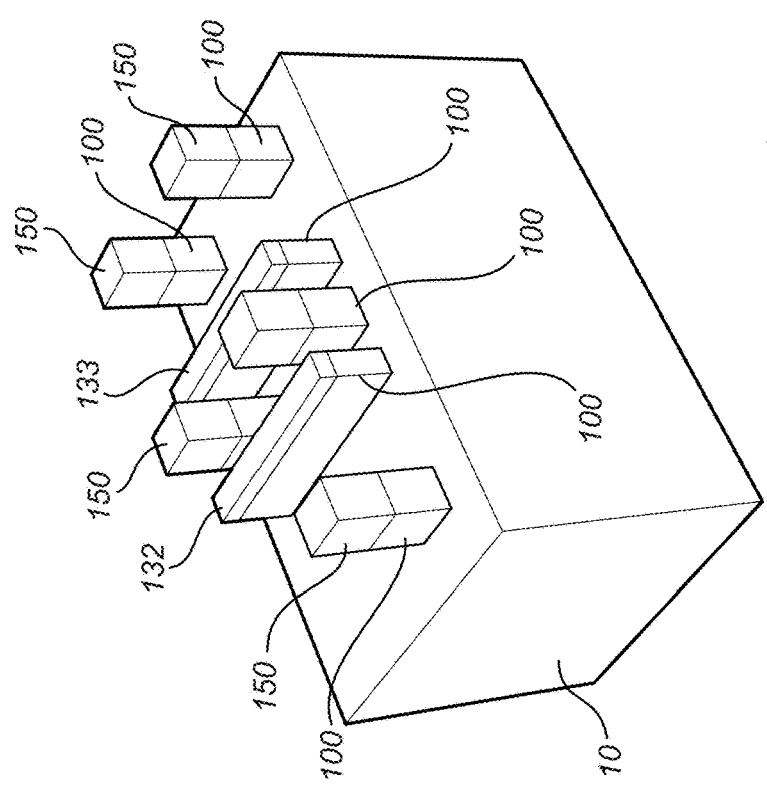

FIGS. 9a and 9b show the device layer 10 after the target layer 100 has been patterned. The remaining portions of the target layer 100, which are masked by the patterned second filler 150 the patterned sacrificial spacers 132, 133 may now define the position and structure, within the routing tracks T1-T6, of contact structures for contacting the underlying device layer 10. Although not shown in the present Figures, is should be noted that the standard cell semiconductor device may comprise inter-connecting, middle-end-of-line, layers providing a connection between the contact structures of the routing tracks T1-T7 and the components of the device layer 10.

Figure 10B:
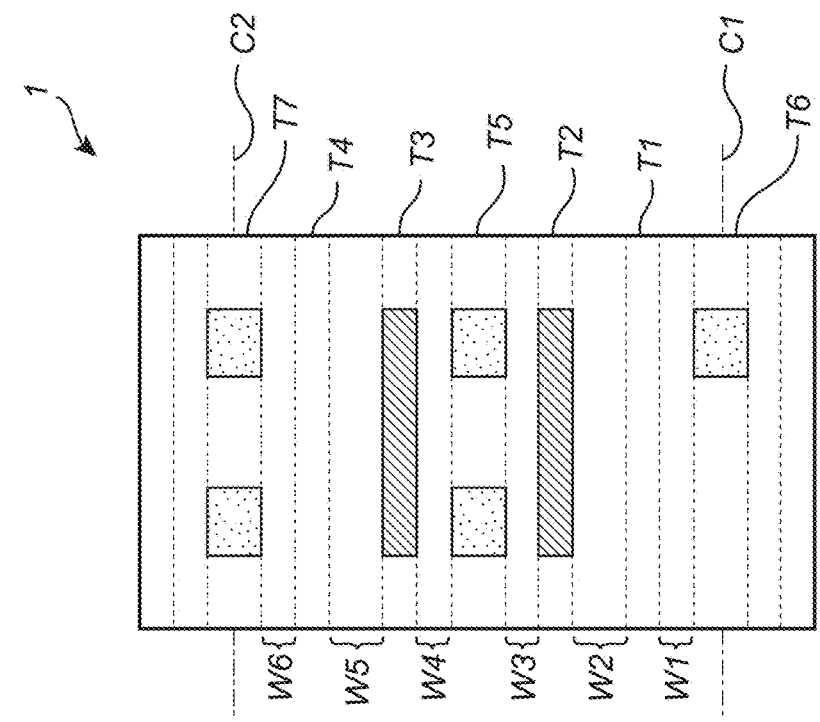
Figure 10A:
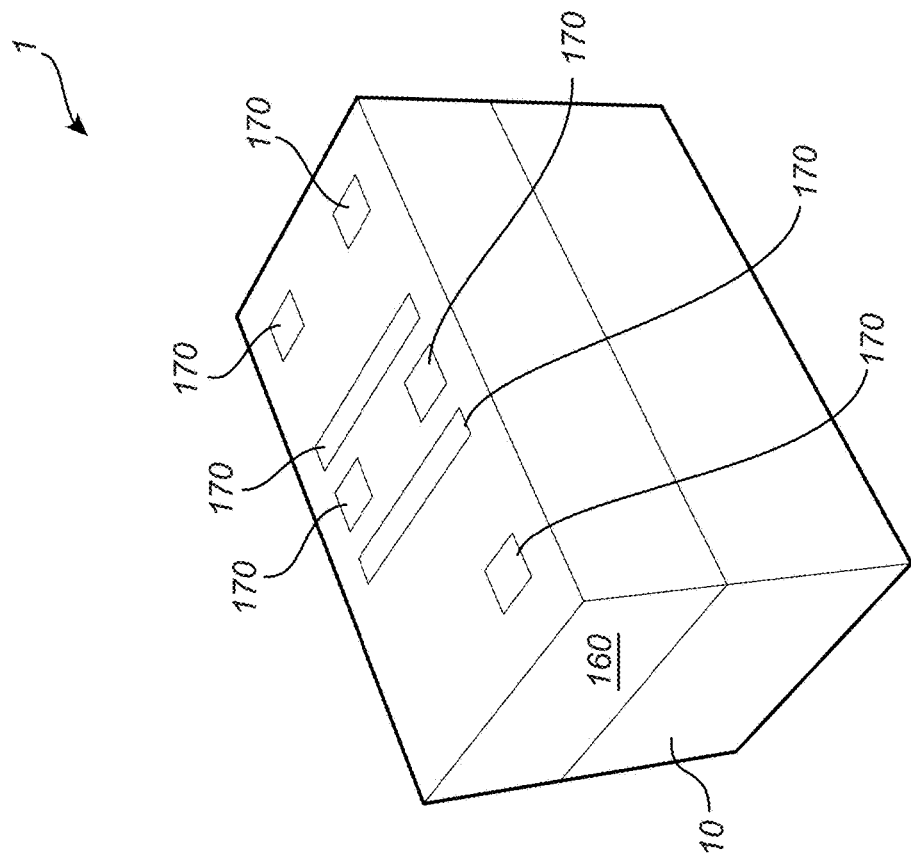

The patterned target layer 100 may be refilled with, e.g., an inter-layer dielectric (ILD) 160 and polished to expose the target layer 100 pattern that is embedded in the ILD 160. In a subsequent step, the material of the target layer 100 may be removed to define trenches in the ILD 160, which may reach down to the underlying contacts of the device layer 10. In FIGS. 10a and 10b, the trenches in the ILD 160 have been filled with a metal 170, such as, e.g., CVD, PVD or electroplated tungsten, cobalt copper or ruthenium, and associated ALD, CVD or PVD barriers and seed layer selected from the list including, e.g., Ti/TiN, TaN, Co and Ru. The metal 170 may form electrically isolated contact structures 170 that can be used for connecting the components of the device layer 10. In one example, the device layer 10 may, e.g., comprise NMOS and PMOS transistors (not shown in the Figures), wherein the contact structures 170 of the edge routing tracks T6, T7 may be used for power supply and ground connection, contact structures 170 of the off-center routing tracks T2, T3 for connection to the source and drain of the transistors, and the contact structures 170 of the central routing track T5 for connection to the gates of the transistors.

FIG. 10b is a top view of the standard cell semiconductor device 1, indicating the minimum distances W1-W6 between adjacent routing tracks T1-T7. The distances W1-W6 may be defined as follows:
W1 between the bottom edge track T6 (arranged over the bottom cell boundary C1) and a first off-center routing track T1,
W2 between the first off-center routing track T1 and a second off-center routing track T2,
W3 between the second off-center routing track T2 and the central routing track T5,
W4 between the central routing track T5 and a third off-center routing track T3,
W5 between the third off-center routing track T3 and a fourth off-center routing track T4, and
W6 between the fourth off-center routing track T4 and a top edge track T7 (arranged over the top cell boundary C2).

The distances W1, W3, W4 and W6 may be determined by the thickness of the second set of spacers 140, and may therefore be essentially equal. Further, the distances W2 and W5 may be defined by the relative positioning of the mandrels, and may preferably by similar to each other. According to the present inventive concept, the distances W1, W3, W4 and W6 may be smaller than the distances W2 and W5, thereby allowing for a standard cell having a reduced height.

According to an exemplary, non-limiting embodiment, the total width of T1 and W2 may be in the order of 32 to 40 nm, such as, e.g., 22 nm routing track T1 and 14 nm spacing W2. Further, T1, T2, T3 and T4 may share same nominal width by construction. W5 may be of the same width as W2 and in the range of 8 to 20 nm, for instance 14 nm. Routing track T5 may be designed to have about same width as routing tracks T1 to T4 at, for instance, 22 nm, but may however be either narrower or wider. Routing tracks T6 and T7 may share a same width, which may, e.g., correspond to 1 to 1.5 times the nominal width of routing track T1, such as 20 to 35 nm. The distances W3 and W4 as well as W1 and W6 may, so as to reduce the cell height, be designed to be narrower in width than W2 and W5, such as, e.g., in the range of 8 to 12 nm.

FIGS. 11a-11b, 12a-12b, 13a-13b and 14a-14b illustrate an example method that may be similar to the method described with reference to the previous Figures, but with the difference that no sacrificial layer is used.

FIGS. 11a and 11b show a perspective view and a top view, respectively, of a stacked structure that may be similarly configured as the structure of FIGS. 1a and 1b. Unlike the intermediate structure of FIGS. 1a and 1b, however, in the illustrated intermediate structure, the mandrels 111, 112, 113 define exposed portion of the target layer 100 instead of a sacrificial layer. That is, the sacrificial layer 130 is omitted.

As shown FIGS. 12a and 12b, the first set of spacers 121-125 may be formed on the sidewalls of the of the mandrels 111, 112, 113 in a similar manner as discussed on connection with FIGS. 2a and 2b.

Next, the mandrels 111, 112, 113 may be removed to expose the underlying portions of the target material 100 as indicated in FIGS. 13a and b, and the second set of spacers 140 formed on the sidewalls of the first set of spacers 121-125. The subsequent processing steps including those illustrated with respect to FIGS. 13a, 13b, 14a and 14b are analogous to the those described in connection with FIGS. 6a to 10b, and will therefore not be repeated herein.

Figure 15B:
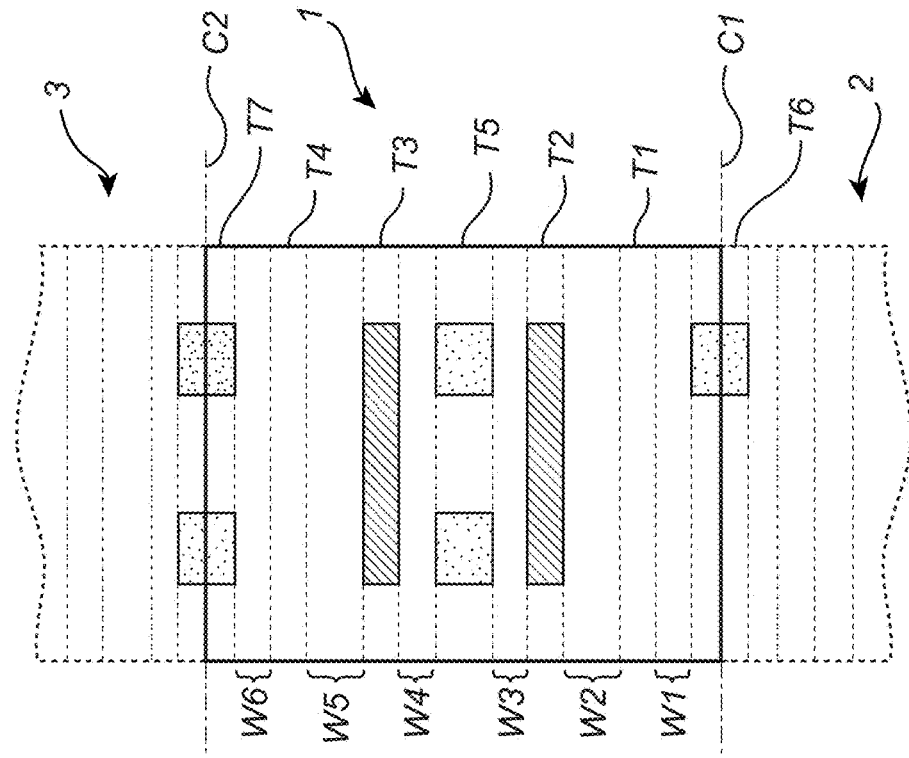
FIGS. 15a and 15b illustrate a standard cell semiconductor device fabricated using a method of fabrication according to embodiments.
Figure 15A:
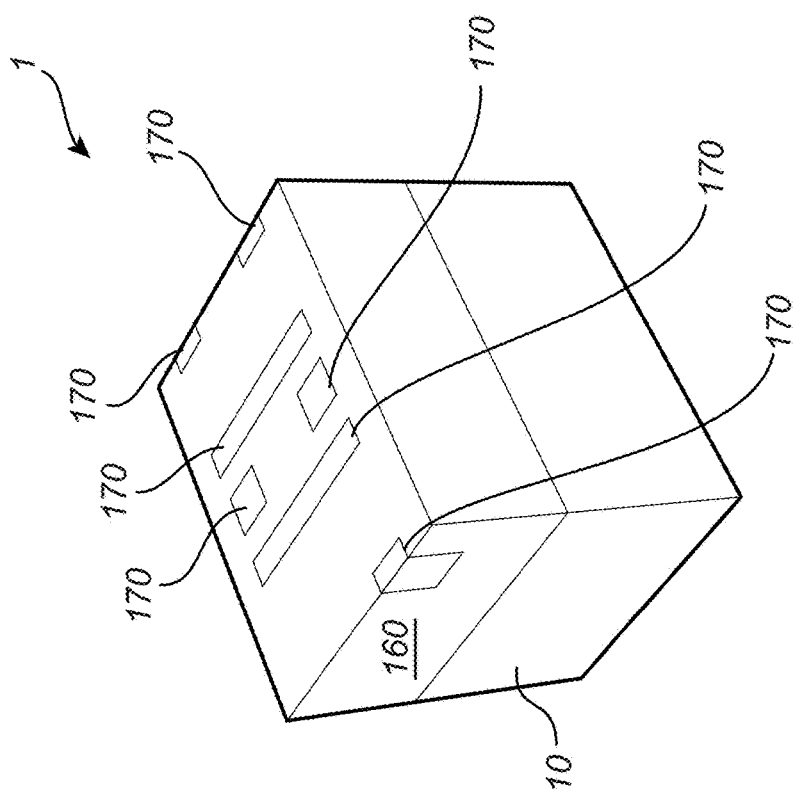

FIGS. 15a and 15b illustrate a standard cell semiconductor device that may be formed by a method that similar to the methods described in connection with the above mentioned Figures. The standard cell semiconductor device 1 may comprise a device layer 10 and routing tracks for contacting the device layer. The routing tracks may include at least two pairs of off-center routing tracks T1, T2; T3, T4 and a central routing track T5 arranged between the pairs of off-center routing tracks. Further, at least two edge tracks T6, T7 may be arranged on opposing sides of the at least two pairs of off-center routing tracks and overlapping a lower boundary C1 and an upper boundary C2 of the standard cell. The minimum distance W1, W3, W4, W6 may be smaller than the distances W2 and W5. The edge tracks T6, T7, overlapping the cell boundaries C1, C2, may be shared with neighbouring standard cell semiconductor devices 2, 3 (which are merely indicated in FIG. 15b). A first one 2 of the neighbouring standard cell semiconductors may thus be arranged adjacent to the lower boundary C1, whereas a second one 3 of the neighbouring standard cells may be arranged adjacent to the upper boundary C2. It will be appreciated that the neighbouring standard cell semiconductor devices 2, 3 may be similarly configured as the standard cell semiconductor device 1 according to the present inventive concept, and may be formed by similar methods as described above.

In the above, the inventive concept has mainly been described with reference to a limited number of examples. However, as is readily appreciated by a person skilled in the art, other examples than the ones disclosed above are equally possible with the scope of the inventive concept, as defined by the appended claims. Variations to the disclosed embodiment may be understood and effected by the skilled person in practising the inventive concept, from a study of the drawings, the disclosure and the appended claims.

What is claimed is:

1. A method of defining routing tracks to be formed in a target layer over a standard cell semiconductor device, the method comprising:
forming a first mandrel, a second mandrel and a third mandrel above the target layer, the second mandrel being arranged between the first mandrel and the third mandrel;
forming a first set of spacers including a first spacer on a sidewall of the first mandrel facing the second mandrel, a second spacer and a third spacer on sidewalls of the second mandrel, and a fourth spacer on a sidewall of the third mandrel facing the second mandrel;
removing the first, second and third mandrels;
using the first set of spacers as a masking layer to pattern a sacrificial layer arranged vertically between the target layer and the first set of spacers, thereby forming a set of sacrificial features including first, second, third and fourth sacrificial features corresponding to the first, second, third and fourth spacers, wherein the set of sacrificial features defines positions of off-center routing tracks (T1, T2, T3, T4); and
forming a second set of spacers on at least part of the sidewalls of the set of sacrificial features, wherein the second set of spacers fill a gap between the first and second sacrificial features and a gap between the third and fourth sacrificial features, while leaving a gap between the second and third sacrificial feature that define a position of a central routing track.

2. The method according to claim 1, wherein the first set of spacers forms a conformal layer on sidewalls of the first to third mandrels.

3. The method according to claim 1, wherein the first mandrel is arranged to overlap a first boundary of the standard cell semiconductor device and another mandrel is arranged to overlap a second boundary of the standard cell, the second boundary opposite the first boundary.

4. The method according to claim 1, further comprising:
forming a plug in the gap between the second and third spacers; and
removing the second set of spacers.

5. The method according to claim 4, further comprising:
patterning the plug and the first set of spacers.

6. The method according to claim 5, further comprising:
patterning the target layer using the plug and the first set of spacers as a mask.

7. The method according to claim 6, further comprising:
refilling the patterned target layer with a dielectric layer; and
replacing the patterned target layer with a metal layer to form electrically isolated contact structures.

8. A method of defining routing tracks in a target layer of a standard cell semiconductor device, the method comprising:
forming a first mandrel, a second mandrel and a third mandrel above the target layer, the second mandrel being arranged between the first mandrel and the third mandrel;
forming a first set of spacers including a first spacer on a sidewall of the first mandrel facing the second mandrel, a second spacer and a third spacer on sidewalls of the second mandrel, and a fourth spacer on a sidewall of the third mandrel facing the second mandrel, wherein the first set of spacers defines positions of off-center routing tracks (T1, T2, T3, T4);
removing the first, second and third mandrels; and
forming a second set of spacers, wherein the second set of spacers fill a gap between the first and second spacers and a gap between the third and fourth spacers, and define a gap between second and third spacers defining a position of a central routing track.

9. The method according to claim 8, further comprising:
forming a plug in the gap between the second and third spacers;
removing the second set of spacers.

10. The method according to claim 9, further comprising:
patterning the plug and the first set of spacers.

11. The method according to claim 10, further comprising:
patterning the target layer using the plug and the first set of spacers as a mask.

12. The method according to claim 11, further comprising:
refilling the patterned target layer with a dielectric layer; and
replacing the patterned target layer with a metal layer to form electrically isolated contact structures.

13. A standard cell semiconductor device, comprising:
a device layer;
routing tracks contacting the device layer; and
the standard cell semiconductor device comprising:
  at least two pairs of off-center routing tracks (T1, T2, T3, T4);
  a central routing track (T5) arranged between the pairs of off-center routing tracks; and
  at least two edge tracks (T6, T7) arranged on opposing sides of the at least two pairs of off-center routing tracks,
  wherein a minimum distance (W3, W4) between the central routing track (T5) and an off-center routing track (T2, T3) closest to the center routing track is smaller than a minimum distance (W2, W5) between adjacent off-center routing tracks.

14. The standard cell semiconductor device according to claim 13, wherein the at least two edge tracks overlap opposite boundaries (C1, C2) of the standard cell.

15. The standard cell semiconductor device according to claim 13, wherein at least one of the routing tracks comprises at least two segments that are electrically isolated from each other.

16. The standard cell semiconductor device according to claim 13, wherein the device layer comprises a transistor, and wherein at least one of the off-center routing tracks is connected to a source or a drain of the transistor.

17. The standard cell semiconductor device according to claims 13, wherein the device layer comprises a transistor, and wherein the central track is connected to a gate of the transistor.

18. The standard cell semiconductor device according to claims 13, wherein the device layer comprises NMOS and PMOS transistors.

19. The standard cell semiconductor device according to claims 13, comprising a CMOS device.

* * * * *

UNITED STATES PATENT AND TRADEMARK OFFICE
CERTIFICATE OF CORRECTION

PATENT NO. : 10,460,067 B2
APPLICATION NO. : 15/791210
DATED : October 29, 2019
INVENTOR(S) : Syed Muhammad Yasser Sherazi Page 1 of 1

It is certified that error appears in the above-identified patent and that said Letters Patent is hereby corrected as shown below:

In the Specification

In Column 1, Line 7, change "Oct. 21," to --Oct. 20,--.

In Column 4, Lines 22-23, change "lithography -etch" to --lithography-etch--.

In Column 11, Line 13, change "of the of the" to --of the--.

In Column 11, Line 30, change "T2;" to --T2,--.

In the Claims

In Column 14, Line 16 (Approx.), Claim 17, change "claims" to --claim--.

In Column 14, Line 20 (Approx.), Claim 18, change "claims" to --claim--.

In Column 14, Line 23 (Approx.), Claim 19, change "claims" to --claim--.

Signed and Sealed this
Third Day of March, 2020

Andrei Iancu
*Director of the United States Patent and Trademark Office*